US010665734B2

(12) United States Patent
Okamoto

(10) Patent No.: US 10,665,734 B2
(45) Date of Patent: May 26, 2020

(54) IMAGE SENSOR AND IMAGE CAPTURING APPARATUS

(71) Applicant: CANON KABUSHIKI KAISHA, Tokyo (JP)

(72) Inventor: Kohei Okamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 163 days.

(21) Appl. No.: 15/693,596

(22) Filed: Sep. 1, 2017

(65) Prior Publication Data
US 2018/0069137 A1    Mar. 8, 2018

(30) Foreign Application Priority Data
Sep. 6, 2016    (JP) .................................. 2016-174001

(51) Int. Cl.
*H01L 31/00* (2006.01)
*H01L 31/0232* (2014.01)
*H01L 27/146* (2006.01)
*H01L 31/02* (2006.01)

(52) U.S. Cl.
CPC .. *H01L 31/02325* (2013.01); *H01L 27/14625* (2013.01); *H01L 31/02016* (2013.01); *H01L 31/02327* (2013.01)

(58) Field of Classification Search
CPC ......... H01L 27/14625; H01L 27/14627; H01L 31/02325; H01L 31/02327; H01L 31/02016

USPC .................................. 250/208.1, 214.1, 216
See application file for complete search history.

(56) References Cited

U.S. PATENT DOCUMENTS

2015/0349011 A1* 12/2015 Kato ................. H01L 27/14625
                                                            250/201.4

FOREIGN PATENT DOCUMENTS

JP     2008-166677 A      7/2008
JP     2009-158800 A      7/2009

* cited by examiner

*Primary Examiner* — Kevin K Pyo
(74) *Attorney, Agent, or Firm* — Cowan, Liebowitz & Latman, P.C.

(57) ABSTRACT

An image sensor comprising: a plurality of pixels that are each provided with a plurality of photoelectric conversion portions and a microlens, and that are configured to read out signals that have been subjected to pupil division, the plurality of pixels each being provided with a light guide that is located between the microlens and the plurality of photoelectric conversion portions, wherein a maximum width of a shape of a cross section, the cross section being parallel with an image sensing surface of the image sensor, of the light guide in an arrangement direction in which the plurality of photoelectric conversion portions that form a pair are arranged is greater than a maximum width of the shape of the cross section in an direction that is orthogonal to the arrangement direction.

8 Claims, 14 Drawing Sheets

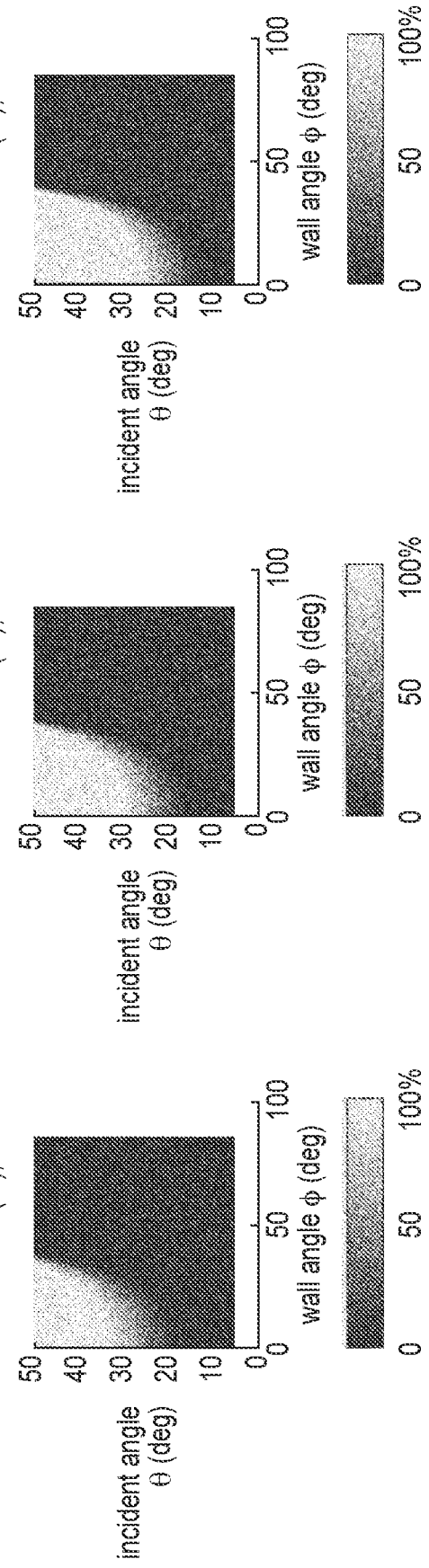
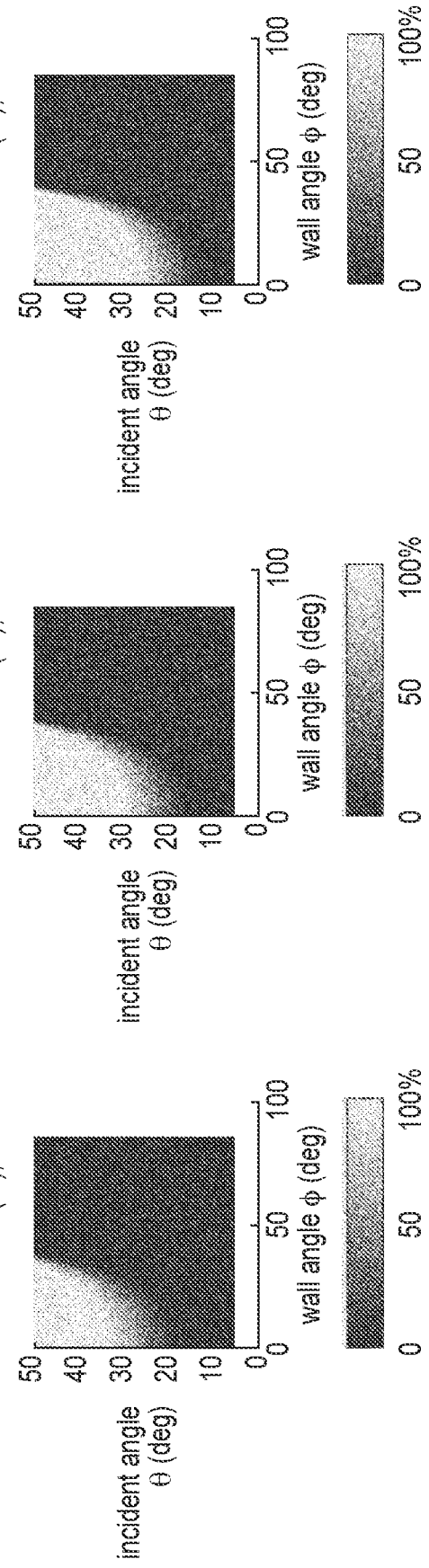
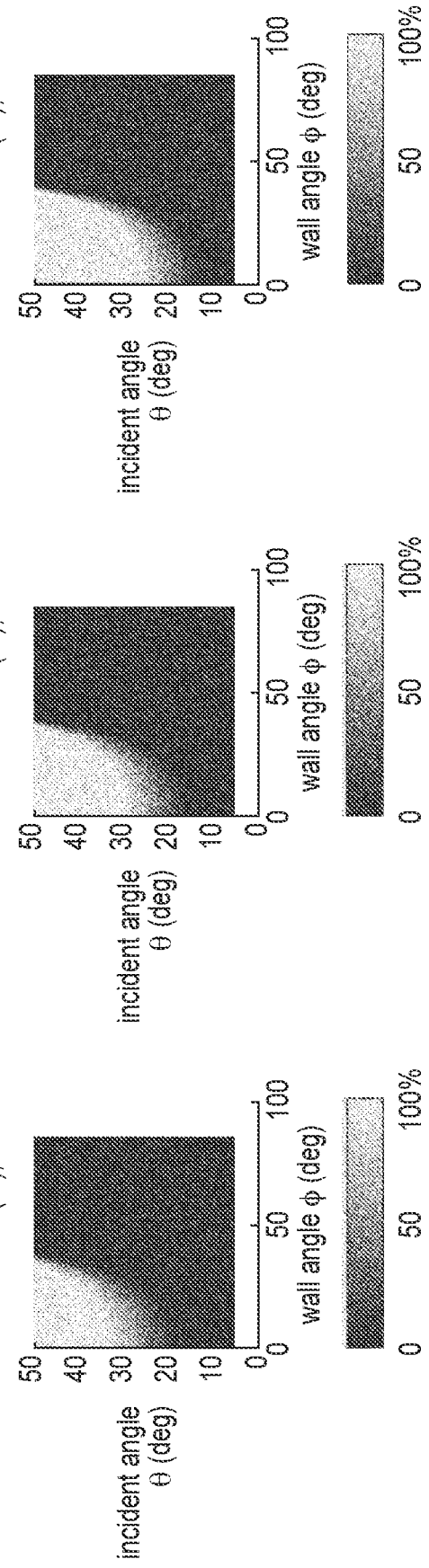
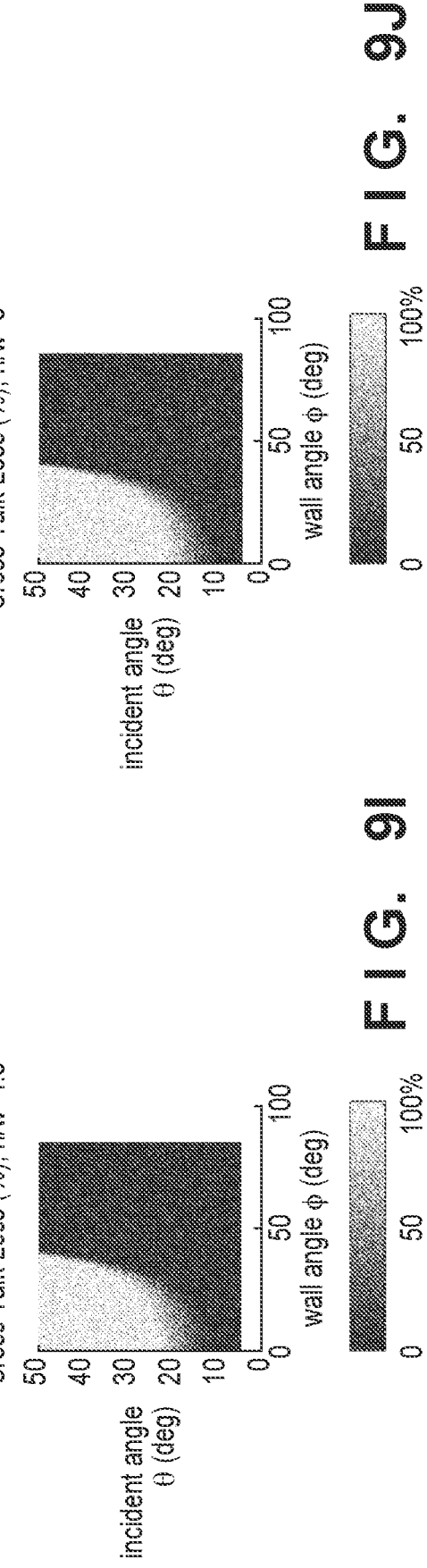
FIG. 9F  FIG. 9G  FIG. 9H  FIG. 9I  FIG. 9J F I G. 10A
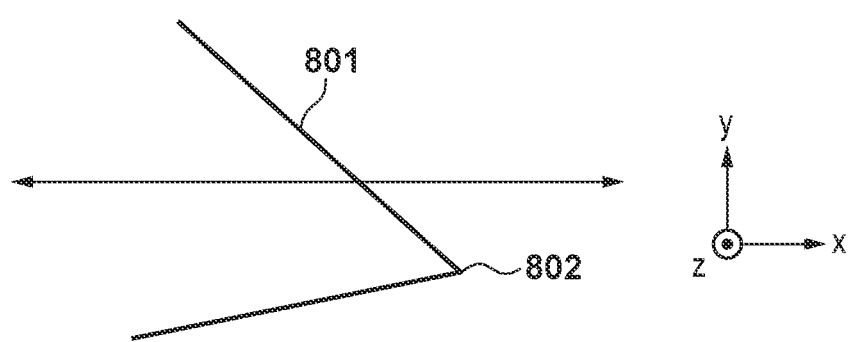
F I G. 10B
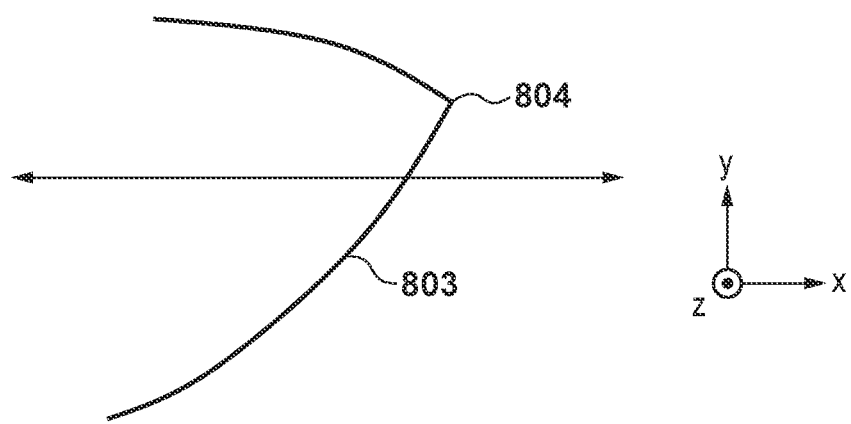

F I G. 13A
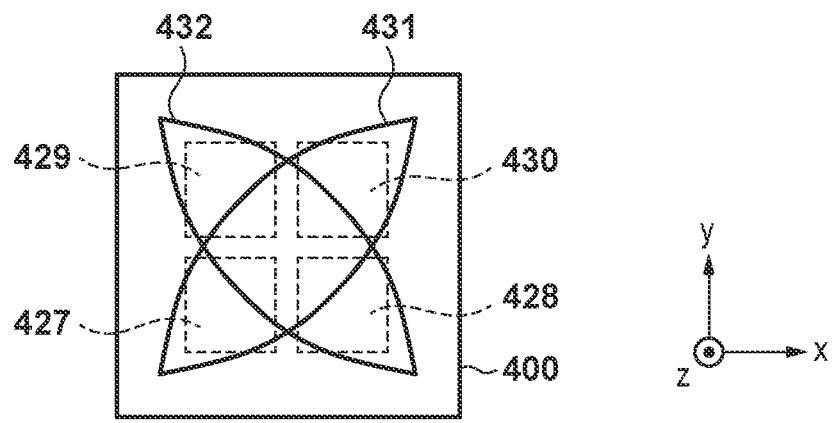
F I G. 13B
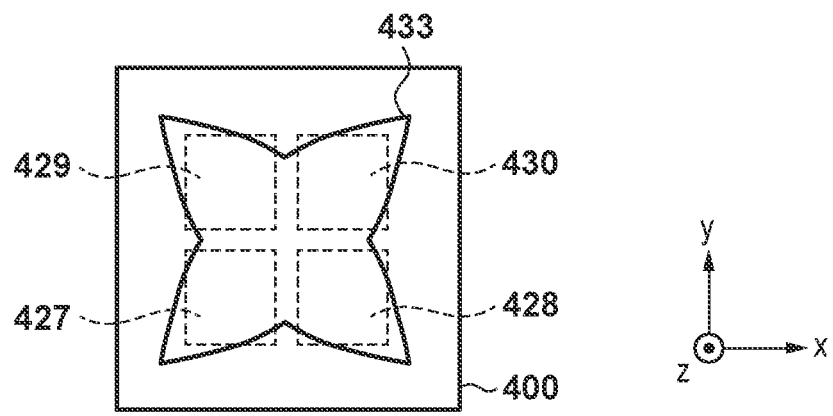

IMAGE SENSOR AND IMAGE CAPTURING APPARATUS

BACKGROUND OF THE INVENTION

Field of the Invention

The present invention relates to an image sensor and an image capturing apparatus.

Description of the Related Art

Conventionally, there is a proposal to provide a light guide between a lens and a photoelectric conversion portion that are provided in each pixel, in order to guide propagated light that has image information from an imaging optical system, to the photoelectric conversion portion. Japanese Patent Laid-Open No. 2008-166677 discloses a configuration in which a light guide is provided between the lens and the photoelectric conversion portion of each pixel, where each pixel has one lens and one photoelectric conversion portion. It is also disclosed that a passivation film, which is the same as a passivation film that is manufactured in another manufacturing step, is formed on a side wall of the light guide, in order to simplify the manufacturing process. Japanese Patent Laid-Open No. 2009-158800 discloses an image sensor in which each pixel has one lens and two photoelectric conversion portions, and that is able to perform focus detection according to a pupil division phase difference method. In this image sensor, light that has been subjected to pupil division is separated and guided to each of the two photoelectric conversion portions. The image sensor has a configuration that is provided with an interlayer film for reducing cross talk between the photoelectric conversion portions, and reducing signal loss that is caused by cross talk.

The conventional technology disclosed in Japanese Patent Laid-Open No. 2008-166677 aims to enable the passivation film to function as a portion inside the light guide; however, the boundary surface between the passivation film and an embedded layer is generated inside the light guide, which degrades light guide efficiency. Also, according to the conventional technology disclosed in Japanese Patent Laid-Open No. 2008-166677, each pixel has one photoelectric conversion portion, and there is no disclosure regarding a configuration for performing pupil division on light that has image information from an imaging optical system. Therefore, it is impossible to perform focus detection according to the pupil division phase difference method.

According to the conventional technology disclosed in Japanese Patent Laid-Open No. 2009-158800, light is scattered or absorbed in a gap for reducing cross talk and signal loss that is caused by cross talk, which degrades light reception efficiency. Also, control that is performed in the step of providing the gap is complex, and it is difficult to realize a high degree of surface accuracy of the boundary surface in the gap, and therefore, variations in signal strength among the pixels, and variations among phase difference signals will be caused.

SUMMARY OF THE INVENTION

The present invention has been made in consideration of the above situation, and reduces cross talk and signal loss that is caused by cross talk, using a light guide in pixels for focus detection according to the pupil division phase difference method.

According to the present invention, provided is an image sensor comprising: a plurality of pixels that are each provided with a plurality of photoelectric conversion portions and a microlens, and that are configured to read out signals that have been subjected to pupil division, the plurality of pixels each being provided with a light guide that is located between the microlens and the plurality of photoelectric conversion portions, wherein a maximum width of a shape of a cross section, the cross section being parallel with an image sensing surface of the image sensor, of the light guide in an arrangement direction in which the plurality of photoelectric conversion portions that form a pair are arranged is greater than a maximum width of the shape of the cross section in an orthogonal direction that is orthogonal to the arrangement direction.

Further, according to the present invention, provided is an image capturing apparatus comprising the image sensor that has a plurality of pixels that are each provided with a plurality of photoelectric conversion portions and a microlens, and that are configured to read out signals that have been subjected to pupil division, the plurality of pixels each being provided with a light guide that is located between the microlens and the plurality of photoelectric conversion portions, wherein a maximum width of a shape of a cross section, the cross section being parallel with an image sensing surface of the image sensor, of the light guide in an arrangement direction in which the plurality of photoelectric conversion portions that form a pair are arranged is greater than a maximum width of the shape of the cross section in an orthogonal direction that is orthogonal to the arrangement direction.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 9A to 9J each show a change in loss due to cross talk being caused between two photoelectric conversion portions when a portion of the side wall of the light guide is inclined.

FIGS. 10A and 10B each show an example of a shape of a cross section of an end portion of the light guide according to the second embodiment.

FIGS. 13A and 13B each show a relationship between a shape of a photoelectric conversion portions that constitutes a focus detection pixel and a shape of a cross section of a light guide according to a modification.

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

First Embodiment

Figure 1:
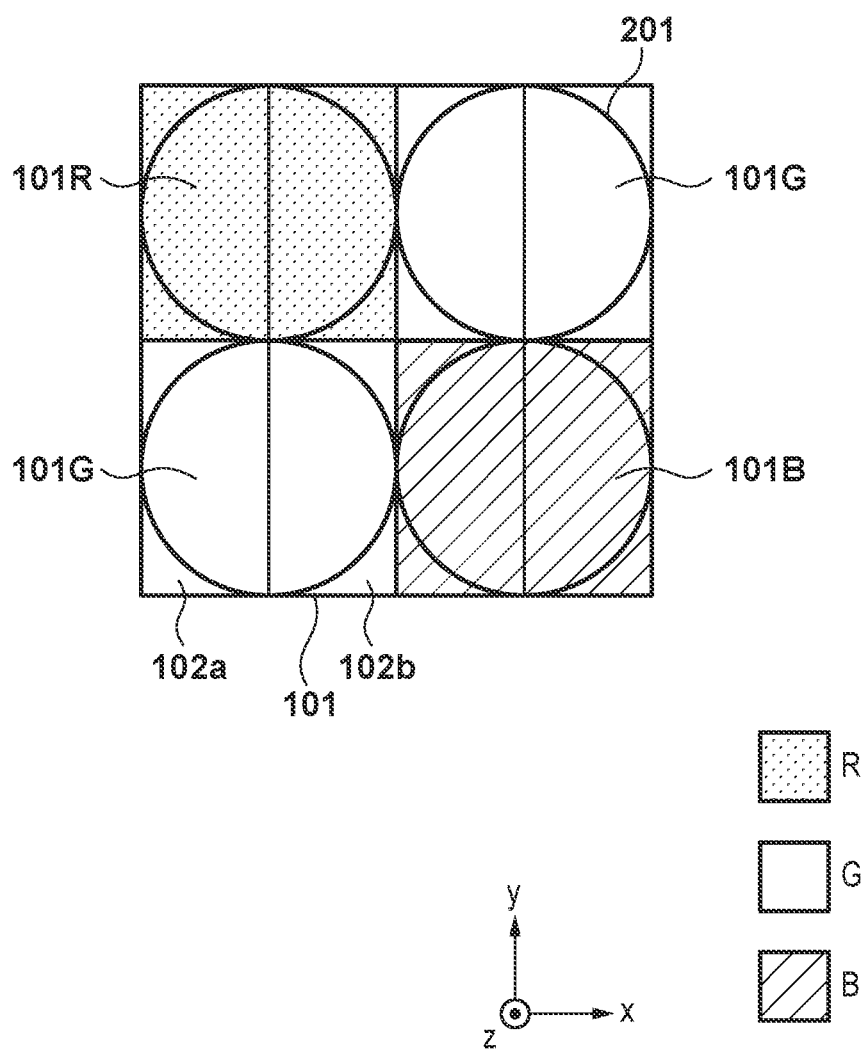
FIG. 1 is a schematic diagram showing an arrangement of pixels and sub-pixels according to an embodiment of the present invention.

First, a first embodiment of the present invention will be described. FIG. 1 is a schematic diagram showing a pixel group 101 that has two rows and two columns, out of a plurality of pixels that are arranged on the image sensing surface of an image sensor such as a CMOS sensor. The pixel group 101 includes a pixel 101R whose spectral sensitivity is in a wavelength band that corresponds to the color red, a pixel 101B whose spectral sensitivity is in a wavelength band that corresponds to the color blue, and two pixels 101G whose spectral sensitivity is in a wavelength band that corresponds to the color green. The pixel group 101 is arranged one after another, and thus a so-called Bayer arrangement is formed. Each pixel includes sub-pixels 102a and 102b that are arranged in one row and two columns for one microlens 201, and each of the sub-pixels 102a and 102b includes a photoelectric conversion portion. By reading out signals from the sub-pixels 102a and 102b such that the signals can be independently obtained, it is possible to perform focus detection according to the phase difference method (the pupil division phase difference method) based on a pair of signals thus obtained. Also, it is possible to obtain an image signal of each pixel by adding signals of the sub-pixels 102a and 102b.

Although it is assumed here that all of the pixels that constitute the image sensor include the sub-pixels 102a and 102b, the present invention is not limited to such a configuration, and it is possible to apply the present invention if the sub-pixels 102a and 102b are included in at least part of the pixels. If this is the case, both image sensing pixels that do not have sub-pixels and focus detection pixels that have sub-pixels exist on the same image sensor. Also, the direction in which the pixels are divided is not limited to the row direction, and part or all of the focus detection pixels may be divided in the column direction.

In the following description, it is assumed that the image sensing surface on which a plurality of pixels are arranged is parallel with an x-y surface, that a direction that is orthogonal to this surface is a z direction, and that the direction in which two photoelectric conversion portions that constitute a pair of photoelectric conversion portions for focus adjustment are arranged is an x direction.

Note that a CMOS sensor that has a pixel pitch of 5.2 μm, and a valid pixel area size that is defined by a horizontal length of 24 mm and a vertical length of 16 mm is assumed as an example of an image sensor. 4614 pixels and 3076 pixels are respectively arranged in the horizontal direction and the vertical direction on the image sensing surface, and the total number of valid pixels is 14,192,664. However, these values may vary depending on the size of the image sensor, the pixel pitch, and the configuration of the pixel groups.

Figure 2B:
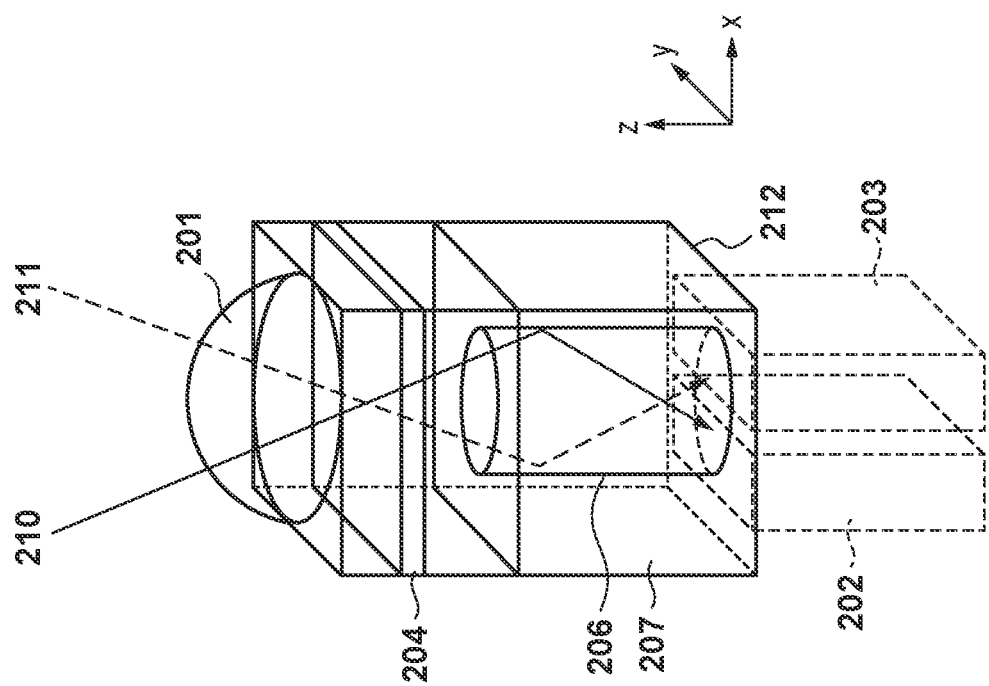
FIGS. 2A and 2B each show an overview of an example of a configuration of a pixel that is provided with a light guide that has a typical cross-sectional shape.
Figure 2A:
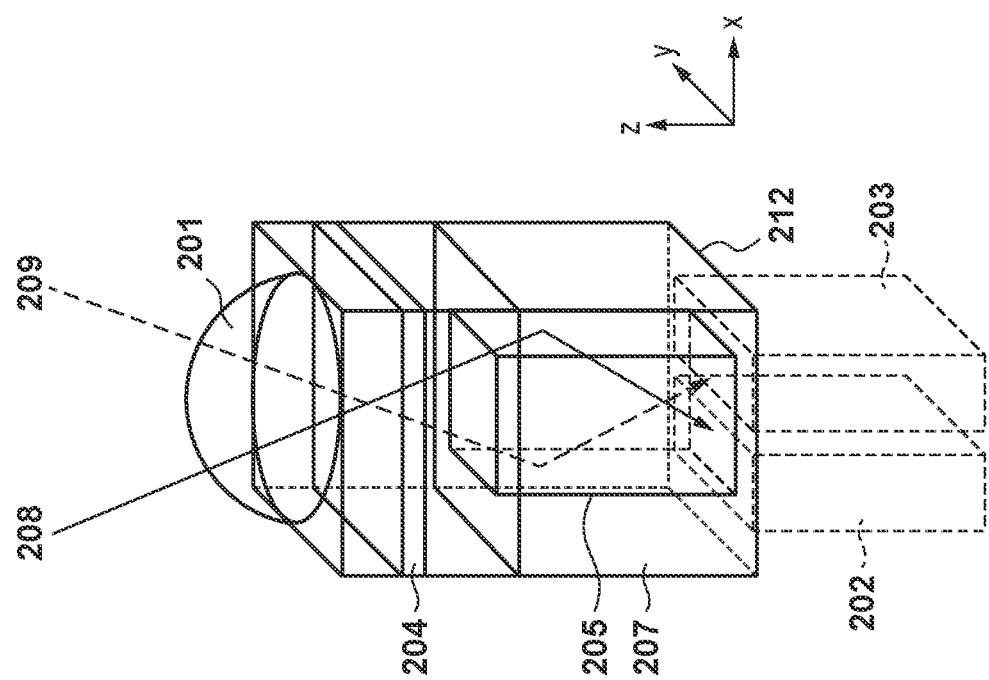

In each of FIGS. 2A and 2B, it is assumed that a light guide that has a typical cross-sectional shape is applied to a pixel that has the above-described sub-pixels. In each of FIGS. 2A and 2B, two photoelectric conversion portions 202 and 203 that respectively correspond to sub-pixels 102a and 102b are formed in an inside portion that includes a silicon (Si) substrate surface 212. The photoelectric conversion portions 202 and 203 are photodiodes that perform a conversion from an imaging light signal to electrical charge, or perform the conversion and accumulate the electrical charge, and are electrically insulated from each other. Main elements such as the microlens 201 for collecting light from the imaging optical system, a color filter 204, a light guide 205 or 206, and an electrical wiring portion 207 that is provided around the light guide 205 or 206 are arranged on the photoelectric conversion portions 202 and 203 of each pixel, in the stated order from the upper side of the image sensing surface (from an +z side). The optical system including the microlens 201 and the light guide 205 or 206 effectively propagates light that has passed through different pupil regions of the imaging optical system (pupil division) to the photoelectric conversion portions 202 and 203. The electrical wiring portion 207 is used to read electrical charge and perform switching. In order to enable the light guides to trap light therein using total reflection, the index of refraction on the light guide 205 or 206 side relative to the boundary surface between the light guide 205 or 206 and the electrical wiring portion 207 is set to be greater than the index of refraction on the electrical wiring portion 207 side.

Figure 3A:
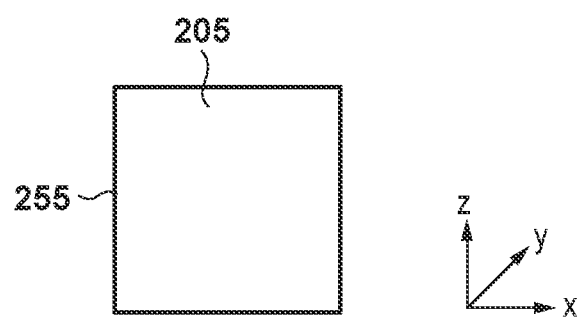
FIGS. 3A and 3B are schematic diagrams showing shapes of cross sections of the light guides shown in FIGS. 2A and 2B.
Figure 3B:
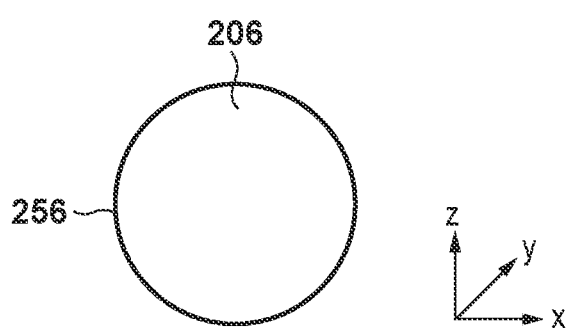

In the examples shown in FIGS. 2A and 2B, the shape of the light guide 205 and the shape of the light guide 206 are respectively a rectangular parallelepiped shape and a circular cylinder shape. The shapes of cross sections 255 and 256 of the light guides, the cross sections 255 and 256 being parallel with a surface (i.e. an x-y surface) that is parallel with a direction in which the plurality of pixels are arranged, respectively have a square shape and a circle shape, as shown in FIGS. 3A and 3B. It is also possible to realize a configuration in which the cross sectional area of the light guide changes depending on the z position without changing the shape of the cross section by imposing restrictions on the manufacturing process or carrying out a design. However, in the examples shown in FIGS. 2A and 2B, the cross-sectional area is constant, independent of the z-position.

If focus detection according to the pupil division phase difference method, by which the defocus amount of the subject is calculated, is performed using signals from the photoelectric conversion portions 202 and 203, it is required that light beams that have passed through different pupil regions of the imaging optical system are respectively guided to the corresponding photoelectric conversion portions. For example, the photoelectric conversion portions that the light rays indicated by arrows 208 and 210 in FIGS. 2A and 2B should enter are the photoelectric conversion portions 203, and the photoelectric conversion portions that the light rays indicated by arrows 209 and 211 should enter are the photoelectric conversion portions 202. However, as indicated by the arrows, a light ray that forms a large angle of incidence with the z direction in a z-x surface are subjected to total reflection by the side wall of the light guide 205 or 206, and then reaches the photoelectric conversion portion that is opposite the target photoelectric conversion portion. That is, in the examples shown in FIGS. 2A and 2B, the light rays indicated by the arrows 208 and 209 respectively reach the photoelectric conversion portions 202 and 203, and the light rays indicated by the arrows 210 and 211 respectively reach the photoelectric conversion portions 202 and 203. The total reflection by the side wall of the light guide causes signal cross talk, which leads to the degradation of pupil division for focus detection. The degree of such cross talk depends on the configuration of the pixels, the relationship between the height and the width of the light guide, and so on. One reason for the fact that cross talk is likely to be caused in such a conventional light guide configuration is that, in a cross section of the light guide, the cross section being parallel with a surface (i.e. an x-y surface) that is parallel with the image sensing surface, the maximum length in the direction that connects the two photoelectric conversion portions and the maximum length in the direction that is perpendicular to the direction that connects the two photoelectric conversion portions are equal to each other.

Figure 4:
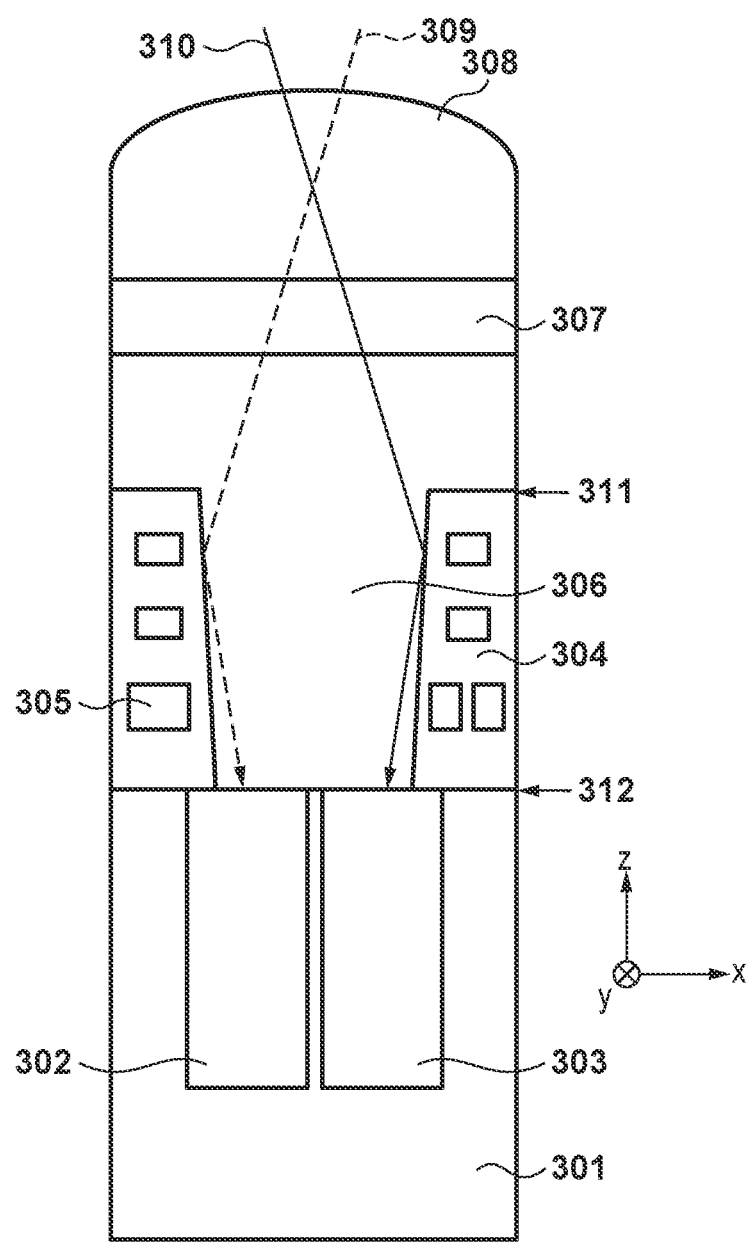
FIG. 4 is a cross-sectional view illustrating a schematic configuration of an image sensor according to the embodiment.

Next, an image sensor according to the first embodiment of the present invention will be described. FIG. 4 is a schematic diagram showing a cross section that shows a schematic configuration of a pixel that includes the sub-pixels 102a and 102b that have been described with reference to FIG. 1, and shows a cross section that passes through the center point of the pixel and is parallel with a z-x surface. n-type photoelectric conversion portions 302 and 303 that correspond to the sub-pixels 102a and 102b are provided in the vicinity of the surface of a p-type silicon substrate 301, and an electrical wiring portion 305 that is made of aluminum is formed in an insulating layer 304 that is made of $SiO_x$ on the substrate 301. The electrical wiring portion 305 is used to read out electrical change accumulated in the photoelectric conversion portions 302 and 303 and to perform gate voltage control, for example. The portion surrounded by the insulating layer 304 is a light guide 306 that is made of silicon nitride (SiN), which is a material that has a higher index of refraction than that of the insulating layer. Further above (in a +z direction), a color filter 307 that allows light in the wavelength band of R, G, or B to pass therethrough is provided, and a microlens 308 is provided on the top.

Ion implantation, photolithography, etching, polishing, sputtering, chemical vapor deposition, and so on are used to manufacture such a pixel. Although various methods are available when manufacturing the microlens, photolithography using grayscale exposure is used here. The arrows 309 and 310 indicate portions of light rays that have passed through different pupil regions of the imaging optical system, which are respectively guided to different photoelectric conversion portions 302 and 303. Defocus information according to the phase difference method is detected based on relative light intensity information that is detected by the photoelectric conversion portions 302 and 303, and the defocus information thus detected can be used to perform a focus adjustment.

Figure 5A:
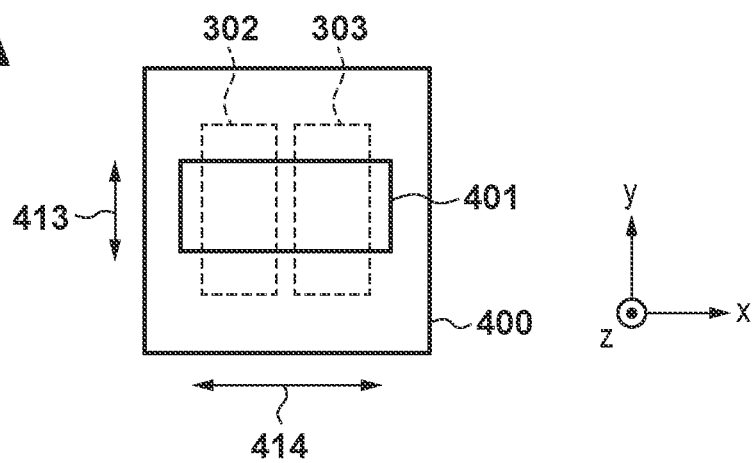
FIGS. 5A to 5C each show a relationship between a shape of a photoelectric conversion portion that constitutes a focus detection pixel and a shape of a cross section of the light guide according to the first embodiment.
Figure 5B:
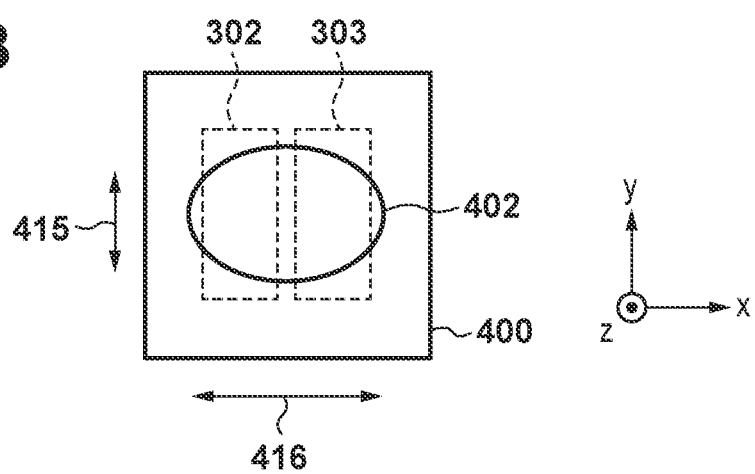
Figure 5C:
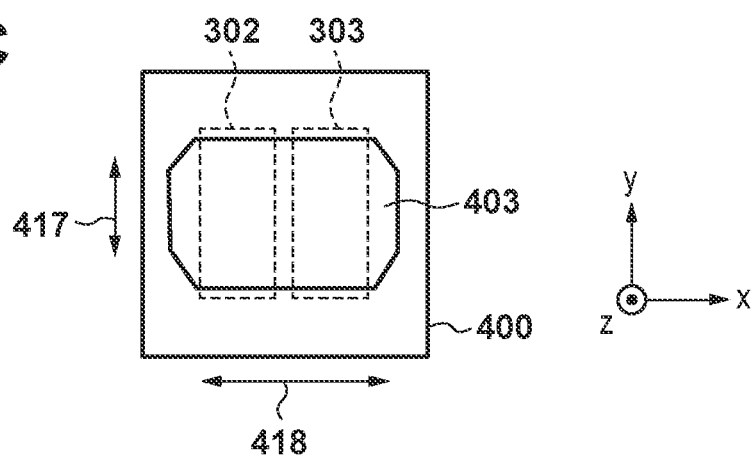

FIGS. 5A to 5C are schematic diagrams illustrating a relationship between the photoelectric conversion portions 302 and 303 of the pixel shown in FIG. 4 and the shape of a cross section of the light guide 306. Here, it is assumed that the area of a cross section of the light guide 306, the cross section being parallel with an x-y surface, is constant independent of the z position.

FIGS. 5A to 5C show examples of different shapes of the cross section of the light guide 306. Two photoelectric conversion portions 302 and 303 are formed in each pixel 400. FIG. 5A shows a rectangular cross section 401, FIG. 5B shows an elliptical cross section 402, and FIG. 5C shows an octagonal cross section 403, as examples of shapes of a cross section of the light guide 306. Here, it is assumed that the shape of the cross section of the light guide 306 is changed such that the area of a cross section of the light guide 306, the cross section being parallel with the x-y surface, has the same area of a cross section in the case where the length-to-width ratio of the shape of the cross section is 1. The shapes of the cross section of the light guide 306 are such that the maximum widths 414, 416, and 418 in the x direction are respectively greater than the maximum widths 413, 415, and 417 in the y direction.

Figure 6:
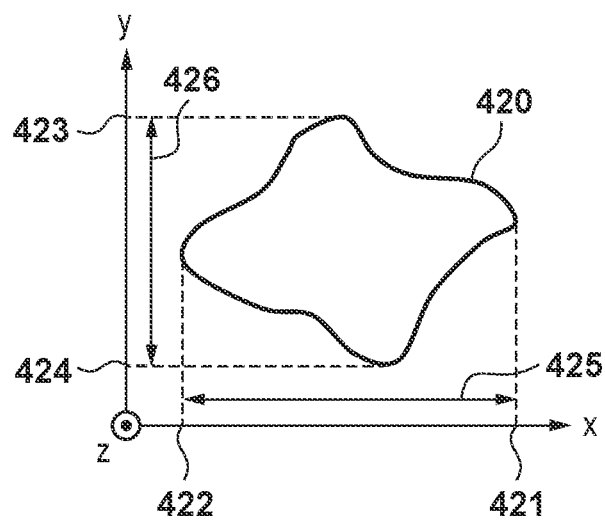
FIG. 6 illustrates a dimension of a shape of a cross section of the light guide according to the first embodiment.

Here, as shown in FIG. 6, a maximum width 425 in the x direction is the difference between a maximum x coordinate 421 and a minimum x coordinate 422 of an outer contour 420 of the light guide. Similarly, a maximum width 426 in the y direction is the difference between a maximum y coordinate 423 and a minimum y coordinate 424 of the outer contour 420 of the light guide.

With such a configuration, the x coordinate of the incident point of the light ray that enters the light guide 306 and the side wall of the light guide 306 in the z-x surface moves away from the center point of the pixel, and the z position of the incident point moves closer to the photoelectric conversion portions 302 and 303. As a result, it is possible to reduce the possibility of light rays reaching unintended photoelectric conversion portions 302 and 303 due to total reflection at the incident point. That is, it is possible to reduce cross talk without providing a gap or the like between the sub-pixels 102a and 102b, and it is possible to improve the precision of pupil division.

Second Embodiment

Next, a second embodiment of the present invention will be described. A light guide according to the second embodiment is characterized by the fact that the outer contour of a cross section thereof that is parallel with the image sensing surface does not include a portion that is orthogonal to a direction in which two photoelectric conversion portions face each other, where the two photoelectric conversion portions constitute a pair of photoelectric conversion portions for performing a focus adjustment according to the pupil division phase difference method. Other configurations are the same as those of the pixel that has been described with reference to FIGS. 1 and 4. Therefore, the descriptions thereof are omitted, and the following describes the shape of the light guide according to the second embodiment.

Figure 7A:
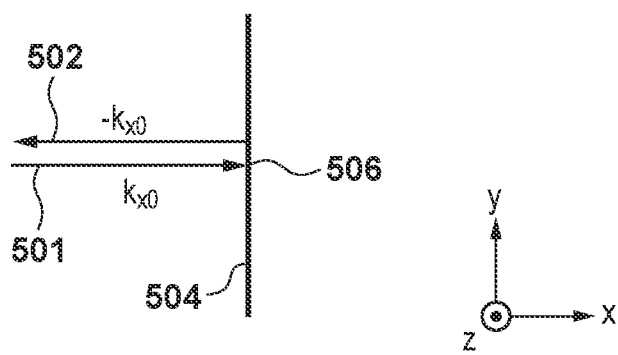
FIGS. 7A and 7B each illustrate a change in a light path of guided light at a side wall of a light guide according to a second embodiment.
Figure 7B:
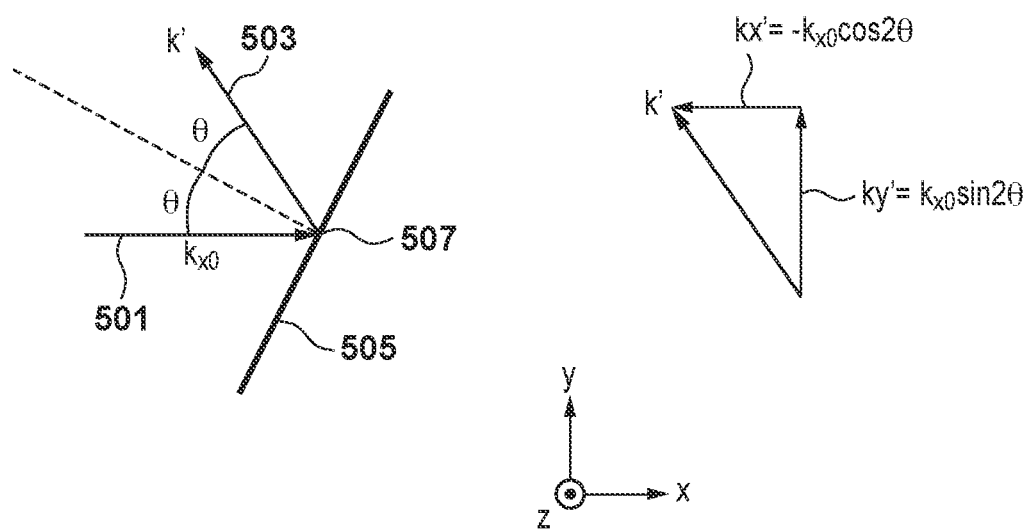

FIGS. 7A and 7B each illustrate a relationship between incident light and a portion of the outer contour of the light guide 306 in a cross section of the light guide 306, the cross section being parallel with the x-y surface at a given z position. FIGS. 7A and 7B respectively show the case where a side (an outer contour) of the light guide 306 is orthogonal to the x direction at an intersection 506 of a wavenumber vector 501 of incident light and the outer contour, and the case where a side (an outer contour) of the light guide 306 is not orthogonal to the x direction at an intersection 507 of the wavenumber vector 501 of incident light and the outer contour. The sides are respectively indicated by reference numerals 504 and 505. In these cases, the wavenumber vector of the incident light is indicated by an arrow 501, and the wavenumber vector of the reflected light is indicated by arrows 502 and 503. In the case of FIG. 7B, the wavenumber vector 503 of the reflected light and the wavenumber vector 501 of the incident light form an angle of 2θ, where θ denotes the angle between the normal of the side 505 and the x axis at the intersection 507. In the case of FIG. 7A, the incident light is regularly reflected, and therefore when the x component of the wavenumber vector of the incident light is $k_{x0}$, the wavenumber vector of the reflected light is $-k_{x0}$. In contrast, in the case of FIG. 7B, the incident light is obliquely reflected, and therefore the x component $k_x'$ of the wavenumber vector of the reflected light is $-k_{x0cos2\theta}$, which is smaller. As a result, a greater portion of the reflected light from the side surface of the light guide 306 reaches the intended photoelectric conversion portions 302 and 303, and it is possible to reduce cross talk between the two photoelectric conversion portions 302 and 303.

Figure 8:
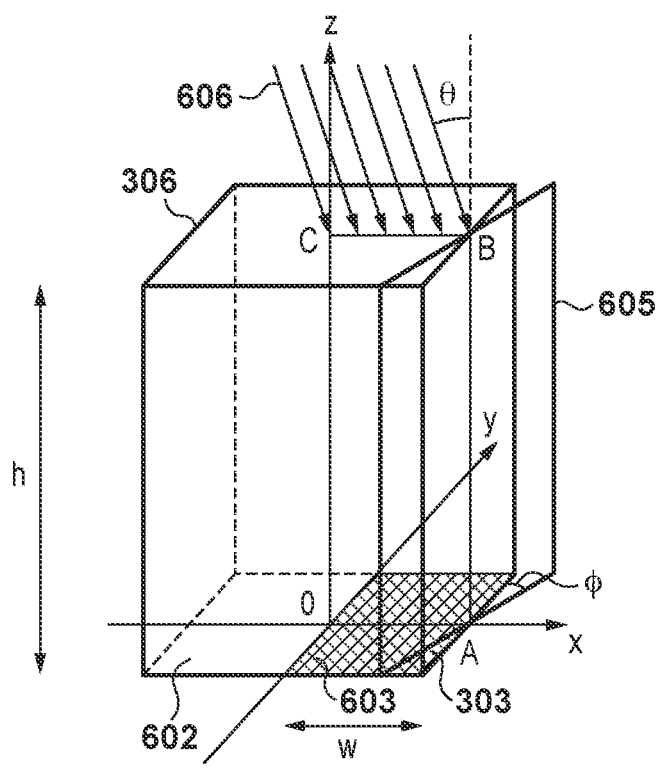
FIG. 8 illustrates that a portion of the side wall of the light guide according to the second embodiment is tilted.
Figure 9A:
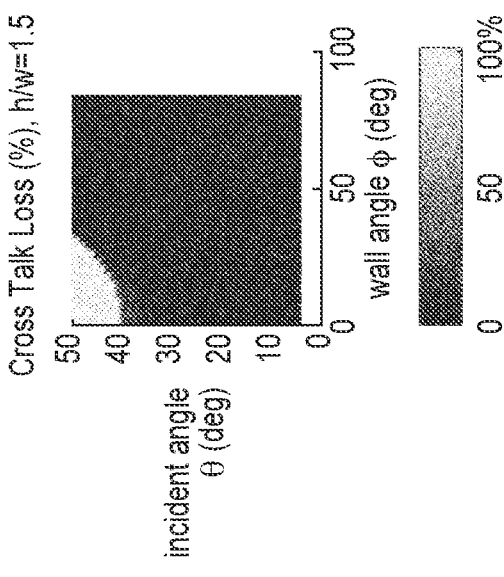
Figure 9B:
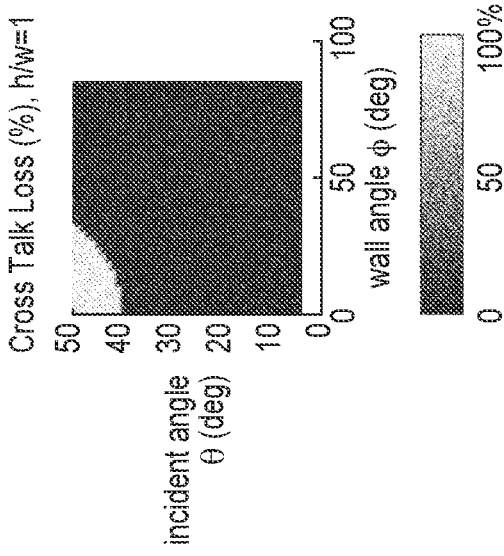
Figure 9C:
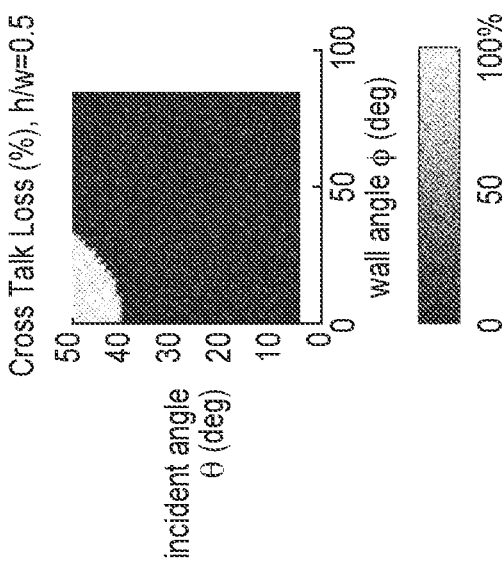
Figure 9D:
Figure 9E:
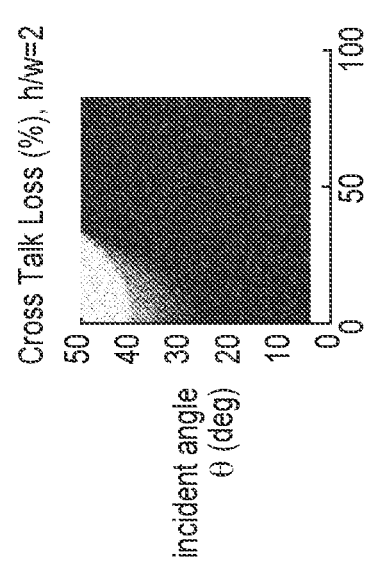

FIG. 8 shows a pixel that is simplified for the sake of description, where the x-y surface is the surface of the silicone substrate, and reference numerals 602 and 603 respectively correspond to the surfaces of the photoelectric conversion portions 302 and 303 of the sub-pixels 102a and 102b. The light guide 306 is located thereon. The width corresponding to each of the sub-pixels 102a and 102b in the x direction is denoted as w, and the height of the light guide 306 is denoted as h. It is assumed that incident light 606 enters a side BC of a surface OABC at an incident angle of θ, and refraction is not taken into consideration. It is assumed that a surface 605, which results from inclining a surface 604 of the sub-pixel 102b of interest that has the photoelectric conversion portion 303 by an angle ϕ about a side AB that serves as an axis, the surface 604 being orthogonal to the x axis, is the side wall of the light guide 306 by which the incident light is totally reflected.

The amount of cross talk that can be reduced when the side, included in the outer contour of the cross section of the light guide, which corresponds to the side wall of the light guide in the case where the input light is totally reflected as shown in FIG. 7B, is not perpendicular to the direction in which the two photoelectric conversion portions are arranged was roughly estimated using one of the sub-pixels that constitute a pixel.

FIGS. 9A to 9J are graphs showing estimations of what proportion of the incident light that is totally reflected off the side AB reaches an area corresponding to −x in the x-y surface, instead of the side OA corresponding to the intended photoelectric conversion portion 303. FIGS. 9A to 9J are graphs showing loss caused by cross talk when h/w is changed. In each graph, the vertical axis indicates the incident angle θ (°) of the incident light, and the horizontal axis indicates the inclination ϕ (°) of the surface 605. In each graph, a reflectance corresponding to the range of angle in which the incident angle to the side wall is greater than the total reflection critical angle is represented as a reflectance that causes 100% loss. In the estimations, it was assumed that the index of refraction inside the light guide 306 is 1.9, and the index of refraction outside the light guide 306 is 1.45. As can been seen from FIGS. 9A to 9J, loss is more likely to be caused as h/w increases and the incident angle θ of the incident light increases. In any of FIGS. 9A to 9J, it is clearly shown that loss can be reduced by increasing the inclination ϕ of the surface 605.

As described above, in the image sensor according to the second embodiment, the shape of the cross section, that is parallel with the image sensing surface, of the light guide does not have a side that is orthogonal to the direction connecting the two intended photoelectric conversion portions for performing phase difference detection (i.e. ϕ≠0 (°) is satisfied for all of the sides or outer contour portions). With such a configuration, it is possible to reduce cross talk, and improve precision of the phase difference detection using pupil division.

Here, FIGS. 10A and 10B each show an example of a shape of a cross section of an end portion of the light guide 306 according to the second embodiment. In FIGS. 10A and 10B, the arrows show a direction (arrangement direction) connecting the two photoelectric conversion portions 302 and 303 for performing a focus adjustment according to the pupil division phase difference method. A portion of the outer contour of the light guide 306 is indicated by reference numerals 801 and 803, and a corner portion is indicated by reference numerals 802 and 804. In the configuration of a pixel employed in the second embodiment, the outer contour of the cross section of the light guide 306 invariably includes a corner portion as shown in FIGS. 10A and 10B. However, in some cases, the corner is not angular in the strict sense and is slightly rounded due to an error in the manufacturing process. A portion of the rounded portion is orthogonal to a direction connecting the two photoelectric conversion portions for performing phase difference detection. However, according to the present invention, it is assumed that the orthogonal portion caused by such an error is acceptable.

FIGS. 11A to 11E show examples of shapes of a cross section of the light guide 306 according to the second embodiment, the cross section being parallel with the image sensing surface. In each of FIGS. 11A to 11D, it is assumed that a direction connecting the two photoelectric conversion portions 302 and 303 for performing a focus adjustment is parallel with the x direction, and the maximum width in a direction that is parallel with the aforementioned direction is denoted as A, and the maximum width in a direction that is orthogonal to the aforementioned direction is denoted as B. In a light guide that has any one of the cross-sectional shapes shown in FIGS. 11A to 11D, the width A is greater than the width B, and the light guide does not have a side that is orthogonal to the x direction. However, the shape of a cross section of the light guide 306 according to the second embodiment is not limited to those shown in FIGS. 11A to 11D.

Figure 11A:
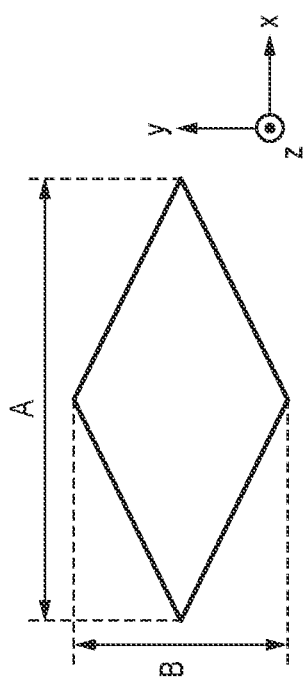
FIGS. 11A to 11E show examples of shapes of a cross section of the light guide, the cross section being parallel with an image sensing surface, and a relationship between a shape of a photoelectric conversion portion that constitutes a focus detection pixel and a shape of the cross section of the light guide according to the second embodiment.
Figure 11B:
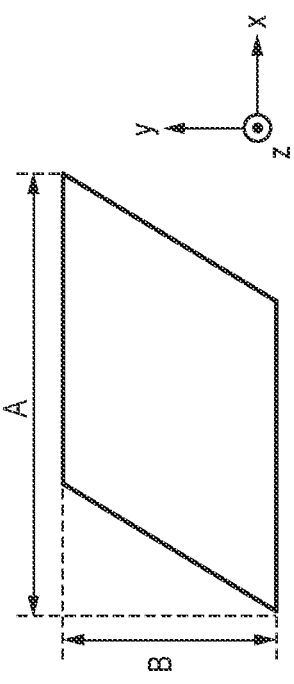
Figure 11C:
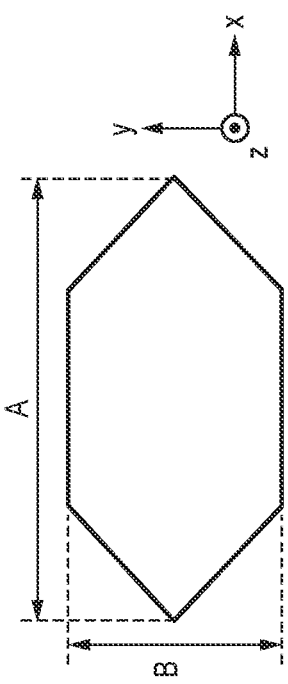
Figure 11D:
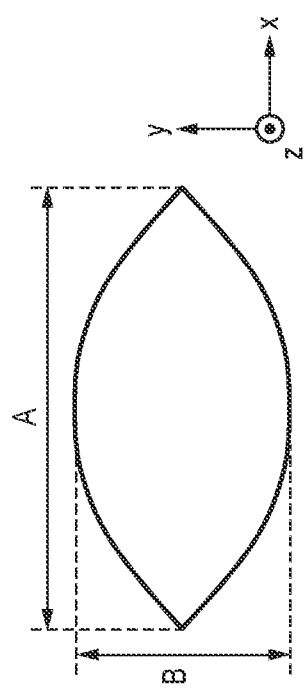
Figure 11E:
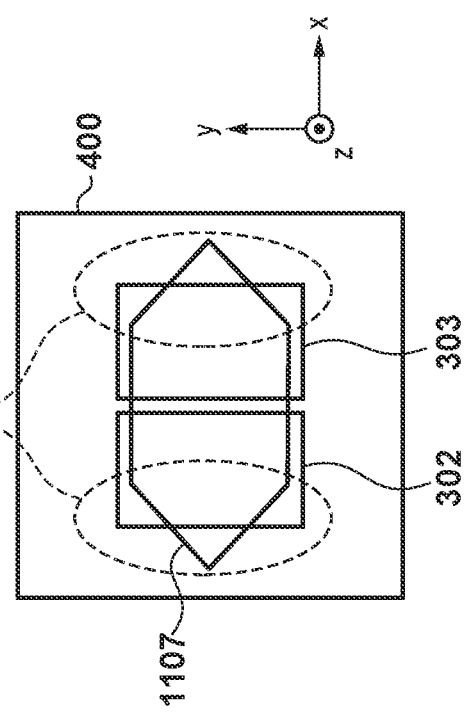

FIG. 11E shows an example of a positional relationship between the light guide 306 that has the cross-sectional shape shown in FIG. 11C and the photoelectric conversion portions 302 and 303. As shown in FIG. 11E, in the shape of the cross section of the light guide 306, the cross section being parallel with the x-y surface, outer contour portions 1108 that face each other in a direction that is parallel with the x axis are isosceles triangles. Furthermore, the area of a cross section 1107 of the light guide 306 in the vicinity of the surface of the substrate is smaller than the total area of the photoelectric conversion portions 302 and 303, and therefore it is possible to improve flexibility when designing the insulating layer and the wiring layer around the light guide 306. This is because the outer contour of the light guide has an oblique component due to the shape of the cross section of the light guide 306 being set to be composed of sides that are not parallel with the y axis, and there is room in the cross section.

According to the above-described second embodiment, it is possible to change the direction of reflection of the incident light that is parallel with the direction in which the two photoelectric conversion portions 302 and 303 face each other (the x direction), at an incident point of the outer contour that constitutes the side wall of the light guide 306, in the cross section of the light guide 306, the cross section being parallel with the image sensing surface (parallel with the x-y surface). Consequently, it is possible to reduce cross talk between the two photoelectric conversion portions 302 and 303.

Third Embodiment

Next, a third embodiment of the present invention will be described. In the above-described first and second embodiments, all of the cross sections of the light guide 306, the cross sections being parallel with the image sensing surface, are protruding when viewed from the inside of the outer contour of the cross section. In contrast, the shape of a cross section of the light guide 306 that is used in the third embodiment is characterized by the fact that the cross section includes both protruding and recessed portions when viewed from the inside of the outer contour of the cross section. Other configurations are the same as those of the pixel that has been described with reference to FIGS. 1 and 4. Therefore, the descriptions thereof are omitted, and the following describes the shape of the light guide according to the third embodiment.

Figure 12A:
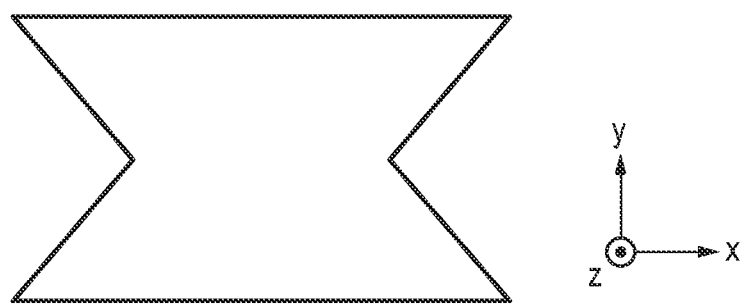
FIGS. 12A to 12D show examples of shapes of a cross section of a light guide, the cross section being parallel with the image sensing surface, and a relationship between a shape of a photoelectric conversion portion/portions that constitutes a focus detection pixel and a shape of the cross section of the light guide according to a third embodiment.
Figure 12B:
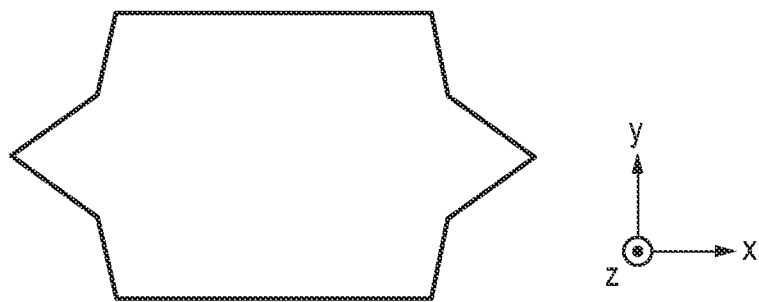

FIGS. 12A to 12D show examples of shapes of a cross section of the light guide 306 according to the third embodiment, the cross section being parallel with the image sensing surface. Note that the direction connecting the two photoelectric conversion portions 302 and 303 for performing a focus adjustment is referred to as the x direction. As shown in FIGS. 12A and 12B, the maximum width of the outer contour of the cross section of the light guide 306 in the x direction is longer than the maximum width of the outer contour in the y direction, and areas that are located away from the center point of the pixel in the x direction are each composed of plurality of sides that are not parallel with the y axis. With such a configuration, it is possible to detect light that forms a larger angle with the z axis, and therefore, it is possible to improve the capabilities to perform pupil division for performing a focus adjustment. Also, since each outer contour portion is composed of a plurality of protruding and recessed portions, it is possible to sufficiently secure an area that is required by the electrical wiring portion around the light guide.

Figure 12C:
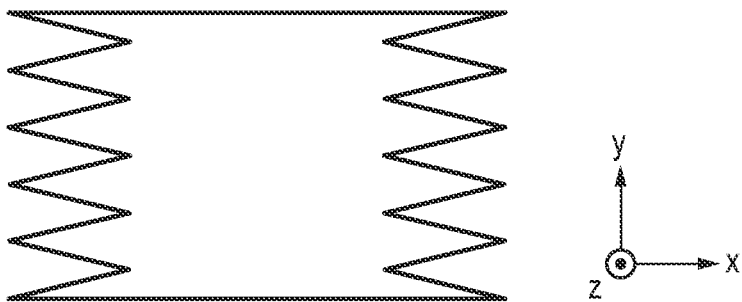

Also, as shown in FIG. 12C, in the case where the outer contour portions that face each other in the x direction are each composed of a plurality of protruding and recessed portions including a plurality of oblique sides, it is possible to increase the angle (φ) of each of the sides included in these portions, relative to the y axis, and therefore it is possible to further reduce cross talk. However, the shape of a cross section of the light guide 306 according to the third embodiment is not limited to those shown in FIGS. 12A to 12D.

Figure 12D:
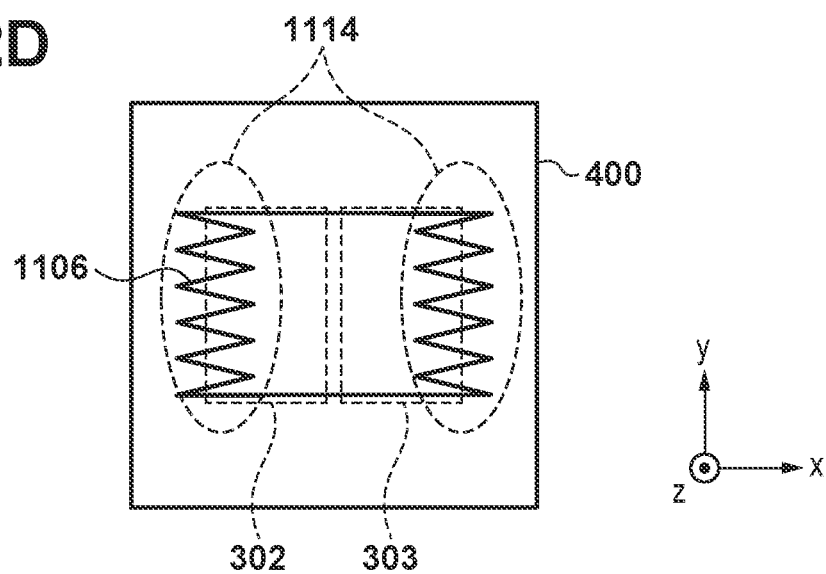

FIG. 12D shows an example of a positional relationship between the light guide 306 that has the cross-sectional shape shown in FIG. 12C and the photoelectric conversion portions 302 and 303. As shown in FIG. 12D, the outer contour of the cross section of the light guide 306, the cross section being parallel with the x-y surface, includes recessed portions and protruding portions. Portions 1114 of the outer circumferential surface, which face each other in a direction that is parallel with the x axis, are each composed of a plurality of sides that form 45° with the y axis, and this configuration makes it possible to reduce loss caused by cross talk between the two photoelectric conversion portions 302 and 303.

As described above, according to the third embodiment, it is possible to further reduce cross talk between two photoelectric conversion portions for performing a focus adjustment, while keeping a large area of a cross section of the light guide.

Modifications

So far, cases where a pixel includes two photoelectric conversion portions (sub-pixels) for performing a focus adjustment according to the pupil division phase difference method have been described. The following describes the shape of a cross section of the light guide 306 along a surface that is parallel with the x-y surface in the case where a pixel includes three or more photoelectric conversion portions for performing a focus adjustment according to the pupil division phase difference method.

FIGS. 13A and 13B each show an example of a cross section of the light guide 306 of a pixel 400, in which four photoelectric conversion portions 427 to 430 are provided to perform a focus adjustment according to the pupil division phase difference method. There are six ways to select a pair of photoelectric conversion portions out of the four photoelectric conversion portions 427 to 430. For example, when the photoelectric conversion portions 428 and 429 form a pair, the x direction is defined as the direction in which these photoelectric conversion portions face each other, and, for example, the light guide 306 has a cross-sectional shape 432 as shown in FIG. 13A. When the photoelectric conversion portions 427 and 430 form a pair, the x direction is similarly defined as the direction in which these photoelectric conversion portions face each other, and, for example, the light guide 306 has a cross-sectional shape 431.

If these two pairs of photoelectric conversion portions are used, the cross-sectional shapes of the light guide 306 respectively corresponding to the two pairs are combined, and the total cross-sectional shape of the light guide 306 is a cross-sectional shape 433 that is shown in FIG. 13B. In this case, in each pair, the maximum width of the total shape of the cross section of the light guide 306 in the x direction and that in the y direction are equal to each other. However, in the present description, the shapes of the cross section of the light guide 306 respectively corresponding to the pair of photoelectric conversion portions of interest need only to satisfy the condition that the maximum width in the x direction is greater than the maximum width in the y direction. That is, it is possible to consider the total shape of the cross section of the light guide 306 by dividing it into cross-sectional shapes that respectively correspond to the pair of photoelectric conversion portions of interest. In this way, if a pixel includes three or more photoelectric conversion portion for performing a focus adjustment according to the pupil division phase difference method, the shape of a cross section of the light guide can be defined for each of a plurality of pairs of photoelectric conversion portions of interest, and the total cross-sectional shape can be determined by combining the cross-sectional shapes.

Fourth Embodiment

Next, a fourth embodiment of the present invention will be described.

In the fourth embodiment, the light guide 306 has any of the shapes according to the above-described first to third embodiments, and the index of refraction of the portion of the light guide 306 inside the side wall with respect to light (guided light) that is propagated through the inside of the light guide 306 is greater than the index of refraction of the portion outside the side wall of the light guide 306.

Here, the side wall of the light guide 306 is a surface that constitutes the outer contour of a cross section that is parallel with the image sensing surface. Since the index of refraction of the portion of the light guide 306 inside the side wall is set to be greater than the index of refraction of the material that surrounds the light guide 306, light inside the light guide 306 is trapped inside the light guide 306 and propagated due to total reflection at the side wall of the light guide 306, and reaches the photoelectric conversion portions. When total reflection is used, it is possible to reduce absorption and loss at the time of reflection, using a material that has a small absorption coefficient as the material of the side wall of the light guide. Examples of the material of the portion inside the side wall of the light guide 306 include, but are not limited to, silicon nitride (SiN) and titanium oxide ($TiO_2$), and examples of the material of the portion of the light guide 306 outside the side wall include, but are not limited to, silicon dioxide ($SiO_2$) and silicon monoxide (SiO).

Also, the side wall of the light guide 306 may be constituted by a layer that is made of a material that exhibits a high reflectance with respect to the guided light. By providing the side wall of the light guide 306 with a reflective layer that is made of a material that exhibits a high reflectance with respect to the guided light, it is possible to guide light to the inside of the light guide 306, regardless of the magnitude relationship between the index of refraction of the portion of the light guide 306 inside the side wall and the portion outside the side wall of the light guide 306. With such an embodiment, it is possible to improve flexibility when selecting the material of the internal and external portions of the light guide 306, and to ease restrictions on the manufacturing process. Examples of the material of the high reflectance layer of the side wall of the light guide include, but are not limited to, tungsten (W), gold (Au), and chromium (Cr).

Furthermore, if a dielectric periodic multilayer film is used as the high reflectance layer of the side wall of the light guide, it is not only possible to realize a higher reflectance, and but also possible to reduce absorption and loss caused by metal.

Note that the light guide according to the present invention does not necessarily guide light by forming an explicit discrete guided mode, and needs only to allow guided light to be propagated through the inside of the light guide while being reflected off the side wall of the light guide.

Fifth Embodiment

Next, a fifth embodiment of the present invention will be explained. In the fifth embodiment, an image capturing apparatus having an image sensor that includes pixels described in any of the first to fourth embodiments will be explained.

Figure 14:
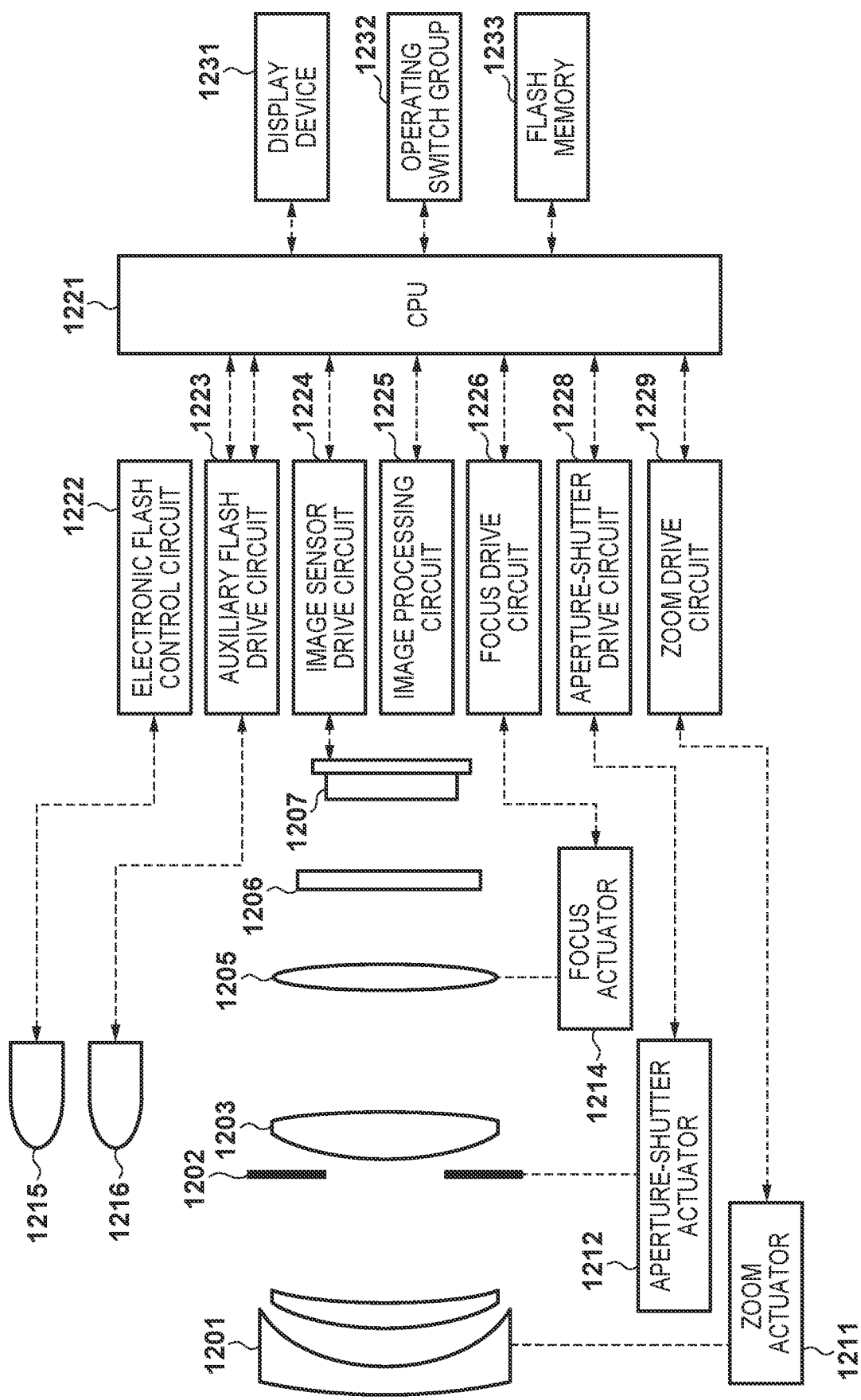
FIG. 14 is a schematic block diagram of an image capturing apparatus according to a fifth embodiment of the present invention.

In FIG. 14, a first lens group 1201 is disposed on the front end of an imaging optical system, and supported so as to be movable forward and backward along an optical axis. An aperture-shutter 1202 adjusts the diameter of its opening under control of an aperture-shutter actuator 1212, thereby adjusting the amount of light during image sensing, and also has a function to adjust the exposure time during still image sensing.

The aperture-shutter 1202 and a second lens group 1203 move together forward and backward along the optical axis, and, in conjunction with the movement forward and backward of the first lens group 1201, provide a magnification change effect (a zoom function). A zoom actuator 1211 carries out a magnification-change operation by rotation of a cam barrel, not shown, to move the first lens group 1201 through the second lens group 1203 forward and backward along the optical axis. A focus actuator 1214 moves the third lens group 1205 forward and backward along the optical axis to adjust the focus.

A low-pass optical filter 1206 is an optical element for the purpose of reducing false color and moiré of a sensed image. An image sensor 1207 is composed of a two-dimensional CMOS photo sensor and the surrounding circuitry, converts incident light to an image signal through photoelectric conversion, and outputs the image signal. An image sensor drive circuit 1224 controls the image capturing operation of the image sensor 1207 as well as A/D-converts acquired image signals and transmits the converted image signals to the CPU 1221. An image processing circuit 1225 performs such processing as γ conversion, color interpolation, JPEG compression and the like on the images acquired by the image sensor 1207.

An electronic flash 1215 for illuminating an object is used during image capturing. A flash illumination device that uses a Xenon tube is preferable, but an illumination device comprised of a continuous-flash LED may also be used. An electronic flash control circuit 1222 controls firing of the electronic flash 1215 in synchrony with an image capturing operation. An AF auxiliary flash unit 1216 projects an image of a mask having a predetermined opening pattern onto an object field through a projective lens to improve focus detection capability with respect to dark objects and low-contrast objects. An auxiliary flash drive circuit 1223 controls firing of the AF auxiliary flash unit 1216 in synchrony with a focus detection operation.

The CPU 1221 in a camera controls the camera main unit in various ways. The CPU 1221 may, for example, have a calculation unit, ROM, RAM, A/D converter, D/A converter, communication interface circuitry, and so forth. In addition, the CPU 1221, based on predetermined programs stored in the ROM, drives the various circuits that the camera has, and executes a set of operations of AF, image capturing, image processing, and recording.

A focus drive circuit 1226 controls the drive of the focus actuator 1214 based on the focus detection result to drive the third lens group 1205 reciprocally in the optical axis direction, thereby performing focus adjustment. An aperture-shutter drive circuit 1228 controls the drive of the aperture-shutter actuator 1212, thereby controlling the opening of the aperture-shutter 1202. A zoom drive circuit 1229 drives the zoom actuator 1211 in accordance with the zoom operation of the user.

A display device 1231, such as an LCD, displays information relating to the image capturing mode of the camera, preview images before image shooting, confirmation images after image shooting, focus state display images during focus detection, and the like. An operating switch group 1232 is composed of a power switch, a release (image capture trigger) switch, a zoom operation switch, an image capturing mode selection switch, and the like. A detachable flash memory 1233 records captured images.

It should be noted that the image capturing apparatus may be any electronic devices having a camera function such as a mobile phone having a camera function and a computer equipped with a camera, in addition to cameras such as digital still cameras and digital video cameras.

Further, the present invention may be applied to a system comprised of a plurality of devices or may be applied to a single device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-174001, filed on Sep. 6, 2016 which is hereby incorporated by reference herein in its entirety.

What is claimed is:

1. An image sensor comprising: a plurality of pixels that are each provided with a plurality of photoelectric conversion portions and a microlens, and that are configured to read out signals that have been subjected to pupil division, the plurality of pixels each being provided with a light guide that is located between the microlens and the plurality of photoelectric conversion portions,
   wherein a maximum width of a shape of a cross section, the cross section being parallel with an image sensing surface of the image sensor, of the light guide in an arrangement direction in which the plurality of photoelectric conversion portions that form a pair are arranged is greater than a maximum width of the shape of the cross section in an orthogonal direction that is orthogonal to the arrangement direction, and
   wherein the shape of the cross section of the light guide has a protruding corner when viewed from an inside of the light guide.

2. The image sensor according to claim 1, wherein the shape of the cross section of the light guide does not include a side that is parallel with the orthogonal direction.

3. The image sensor according to claim 1, wherein a portion of the shape of the cross section of the light guide is recessed when viewed from an inside of the light guide.

4. The image sensor according to claim 1, wherein, if the plurality of photoelectric conversion portions form a plurality of pairs, the shape of the cross section of the light guide of each pixel is a shape resulting from combining shapes of cross sections of the light guide, the cross sections respectively corresponding to the plurality of pairs of photoelectric conversion portions of the pixel.

5. The image sensor according to claim 1, wherein an index of refraction of a material of the light guide is greater than an index of refraction of a material that surrounds the light guide.

6. The image sensor according to claim 1, wherein a layer that exhibits a high reflectance with respect to guided light is formed on a side wall of the light guide.

7. The image sensor according to claim 6, wherein the layer that exhibits a high reflectance is a multilayer film.

8. An image capturing apparatus comprising the image sensor that has a plurality of pixels that are each provided with a plurality of photoelectric conversion portions and a microlens, and that are configured to read out signals that have been subjected to pupil division, the plurality of pixels each being provided with a light guide that is located between the microlens and the plurality of photoelectric conversion portions,
   wherein a maximum width of a shape of a cross section, the cross section being parallel with an image sensing surface of the image sensor, of the light guide in an arrangement direction in which the plurality of photoelectric conversion portions that form a pair are arranged is greater than a maximum width of the shape of the cross section in an orthogonal direction that is orthogonal to the arrangement direction, and
   wherein the shape of the cross section of the light guide has a protruding corner when viewed from an inside of the light guide.

* * * * *